United States Patent
Pfaffinger et al.

(10) Patent No.: US 11,240,951 B2
(45) Date of Patent: Feb. 1, 2022

(54) METHOD AND DEVICE FOR ALLOCATING ASSEMBLIES TO PLACEMENT LINES

(71) Applicant: SIEMENS AKTIENGESELLSCHAFT, Munich (DE)

(72) Inventors: Alexander Pfaffinger, Munich (DE); Christian Royer, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 415 days.

(21) Appl. No.: 16/082,308

(22) PCT Filed: Mar. 10, 2016

(86) PCT No.: PCT/EP2016/055140
§ 371 (c)(1),
(2) Date: Sep. 5, 2018

(87) PCT Pub. No.: WO2017/152981
PCT Pub. Date: Sep. 14, 2017

(65) Prior Publication Data
US 2019/0082567 A1    Mar. 14, 2019

(51) Int. Cl.
*H05K 13/08* (2006.01)
*G06Q 10/04* (2012.01)
*G06Q 50/04* (2012.01)

(52) U.S. Cl.
CPC .......... *H05K 13/085* (2018.08); *G06Q 10/04* (2013.01); *G06Q 50/04* (2013.01)

(58) Field of Classification Search
USPC ...................................................... 700/121
See application file for complete search history.

(56) References Cited

U.S. PATENT DOCUMENTS 4,335,459 A * 6/1982 Miller ................. G06F 11/1008
                                                    365/200
5,258,915 A    11/1993 Billington et al.
(Continued)

FOREIGN PATENT DOCUMENTS

DE    102008020167 A1    7/2009
DE    102011076565 B4    6/2014
(Continued)

OTHER PUBLICATIONS

Machine Translation of Pfaffinger (DE 102011076565 B4). Foreign language version cited in IDS dated Mar. 12, 2020. (Year: 2014).*
(Continued)

*Primary Examiner* — Rocio Del Mar Perez-Velez
*Assistant Examiner* — Christopher W Carter
(74) *Attorney, Agent, or Firm* — Schmeiser, Olsen & Watts, LLP

(57) ABSTRACT

Provided is a method for allocating assemblies to placement lines for placing components on the assemblies, wherein an expected production time is determined for each assembly type of the assemblies to be provided with components and for each placement line, taking into consideration each cycle time for the assembly type on the placement line and the expected number of pieces to be produced for each assembly type. The actual number of pieces to be produced arises according to a predeterminable probability distribution, wherein the possible allocations of assemblies to the placement lines are restricted by the existing infrastructure and/or by user defined specifications, and the allocation of the assemblies to the placement lines is calculated by means of an optimization method.

21 Claims, 2 Drawing Sheets

(56) References Cited

U.S. PATENT DOCUMENTS

| | | | | |
|---|---|---|---|---|
| 5,875,431 | A | * | 2/1999 | Heckman ............... G06Q 10/04 705/7.16 |
| 6,829,514 | B2 | * | 12/2004 | Gyorfi .................. H05K 13/085 700/99 |
| 10,061,306 | B2 | * | 8/2018 | Craiovan ............. H05K 13/085 |

FOREIGN PATENT DOCUMENTS

| | | |
|---|---|---|
| EP | 2894528 A1 | 7/2015 |
| JP | H04257968 A | 9/1992 |
| JP | H0724701 A | 1/1995 |
| JP | H08255197 A | 10/1996 |
| JP | 2006287075 A | 10/2006 |
| WO | 2014005741 A1 | 1/2014 |
| WO | 2014005743 A1 | 1/2014 |
| WO | 2014005744 A1 | 1/2014 |
| WO | WO 2014005741 A1 | 1/2014 |
| WO | WO 2014005743 A1 | 1/2014 |
| WO | WO 2014005744 A1 | 1/2014 |
| WO | 2015121927 A1 | 8/2015 |
| WO | WO 2015121927 A1 | 8/2015 |

OTHER PUBLICATIONS

Emet, Stefan et al. Workload balancing in printed circuit board assembly. Feb. 21, 2010. Springer-Verlag. 1175-1182. (Year: 2010).*

Toth, Attila et al. Machine configuration and workload balancing of modular placement machines in multi-product PCB assembly. Jan. 24, 2018. Informa UK Limited. vol. 31:9. 815-830. (Year: 2018).*

Zhang Hong-wei "The Application on Surface Mount Technology (SMT) in the Laboratory" Journal of Nanyang Teachers College (Natural Siences Edition) vol. 2 Mar. 2003.

Method for SMT passive components.

Japanese Office Action dated Aug. 27, 2019 for Application No. 2018-548007.

ASM Assembly Systems, http://www.siplace.com/en/Home, Oct. 3, 2016.

* cited by examiner

☐ Probability distribution W1
▨ Probability distribution W2

☐ Probability distribution W1
▨ Probability distribution W2

METHOD AND DEVICE FOR ALLOCATING ASSEMBLIES TO PLACEMENT LINES

CROSS-REFERENCE TO RELATED APPLICATIONS

This application claims priority to PCT Application No. PCT/EP2016/055140, having a filing date of Mar. 10, 2016, the entire contents of which are hereby incorporated by reference.

FIELD OF TECHNOLOGY

The following relates to a method for assigning assemblies to component fitting lines for fitting the assemblies with components. Additionally, the following relates to an apparatus for a production or assembly line for fitting assemblies with components. Moreover, the following relates to a computer program product (non-transitory computer readable storage medium having instructions, which when executed by a processor, perform actions) and a computer-readable medium.

BACKGROUND

In particular in the field of electronics production, printed circuit boards or assemblies to be produced are manufactured on SMT component fitting lines by means of surface mounting (surface mounted technology, SMT). A manufacturer of SMT component fitting machines and systems with the product name SIPLACE is the ASM company (http://www.siplace.com/en/Home), for example.

On account of technical restrictions, not every assembly can be produced on every component fitting line, however. The assemblies for the most part also have different production times on the component fitting lines. Also, the maximum production time capacities of the component fitting lines cannot be exceeded.

The assignment of assemblies to component fitting lines of a component fitting system is usually made manually or semiautomatically, based on empirical values or heuristics.

In the case of one possible use of mathematical optimization methods, linear optimization methods are possible. Linear optimization is concerned with the optimization of linear target functions over a set limited by linear equations and inequations. It is the basis of the solution methods of (mixed) integer linear optimization. What is known as a solver is a group designation for specific mathematical computer programs that can solve mathematical problems numerically. In connection with MIP (mixed integer linear programming), standard solvers such as e.g. CPLEX, Gurobi, Ilog, Xpress can be used for small IP programs (integer optimization models). Conceivable small IP programs are instances having two lines, 181 assemblies and 839 component types, for example. For larger instances, standard solvers such as CPLEX can give rise to problems for solving this more complex problem.

Since the planning horizon during production is for the most part medium-term, there are uncertainties with regard to the future numbers of items of the different assembly types. This can lead to undesirably large fluctuations in the utilization levels/production times of the component fitting lines. Therefore, it is desirable in practice to avoid assembly line assignments that mean that particularly high production time fluctuations can arise for individual lines. This can result in the applicable lines often running above capacity or below capacity.

Since production times for the aforementioned methods are also supposed to be taken into consideration in the secondary conditions, the heuristic methods usually involve fictitious assumptions being derived or deduced for the values such as e.g. the production time restrictions. This normally proceeds in a kind of "Trial and Error" and may ultimately be very computational-intensive.

SUMMARY

An aspect relates to an improved optimization method or technique for assigning assemblies to component fitting lines.

Embodiments include a method for assigning assemblies to component fitting lines for fitting the assemblies with components wherein an expected production time is ascertained for each assembly type of the assemblies to be fitted with components and each component fitting line taking into consideration the respective cycle time for the assembly type on the component fitting line, and the expected number of items to be produced per assembly type, wherein the actual number of items to be produced arises according to a previously determinable probability distribution, wherein the possible assignments of assemblies to component fitting lines are limited by the existing infrastructure and/or by user-defined presets, and the assignment of the assemblies to the component-fitting lines is computed by means of an optimization method, wherein the computation of the assignment is effected such that for the probability distributions with respect to the sum of the expected production times per component fitting line that result from the cited probability distributions for the numbers of items, the differences from their respective expected value of these resultant probability distributions are minimized.

An embodiment of the invention is the minimization of the sum of the differences from the respective expected value.

The advantage of the approach according to embodiments of the invention is that it is now also possible for problems with larger instances to be solved less computationally intensively than described at the outset.

The optimization method applied can be what is known as integer linear programming. This allows commercial standard solvers to be used.

The cited differences from the expected values of the resultant probability distributions can assume similar or like values. In this context, similar can mean that a maximum difference at the top or bottom is permitted. "Like" in this context can mean identical. However, (almost) like values also result in slight inaccuracies in the form of minor differences at the top or bottom being possible, wherein, in contrast to "similar", a minor difference of this kind is barely plannable and therefore barely predeterminable.

For the set of assemblies assigned to a component fitting line, the sum of the expected production times should not exceed a maximum utilization level of the respective component fitting line over time.

It may be useful if each assembly type is assigned to precisely one component fitting line.

The difference from the sum of the expected production times of a component fitting line can be expressed as a variance thereof.

The variance per component fitting line can be determined by the sum of all assembly types assigned to the component fitting line from the product of the square of the difference from the expected number of items of an assembly type within a period and the associated values of the resultant probability distributions and multiplied by the square cycle time.

Said variance is limitable to a prescribable maximum threshold value and can be minimized if need be by prescribing a maximum threshold value, referred to as $VarMax_l$ in the exemplary embodiment described below. The maximum threshold value can be prescribed in this case in the form of an interval limited at the top and/or the bottom.

The width of the interval can be stipulated as a percentage on the basis of one of the values limiting the interval.

The input data used for the integer linear programming can be the following data describing the infrastructure:
  number of component fitting lines,
  number of assemblies,
  number of assembly types,
  expected number of items of the assembly types per component fitting line,
  production time limit per respective component fitting line,
  cycle time of the assembly type on the component fitting line and probability distributions for the expected numbers of items of the assembly types.

An equipment family is determined as a set of assemblies that can be fitted with components on a component fitting line without changing the set of component types kept on the component fitting line for component fitting. The set of component types kept on the component fitting line is also called equipment. Usually, a component fitting line has more assemblies assigned to it than an equipment family can comprise, since it is not possible for any number of component types to be kept on the component fitting line. The component fitting line is therefore occasionally subjected to a change of equipment, which involves the equipment for a first equipment family being changed for the equipment for a second equipment family. The rarer these equipment changes are and the fewer the component types that have to be changed in the event of an equipment change, the less time consuming the operation of the component fitting system can be. The total number of equipment families used in the component fitting system may be a more realistic quality indicator than, by way of example, the component variance of a component fitting line. The component variance of a component fitting line is given by the number of different component types whose components are to be fitted to one of the assemblies assigned to the component fitting line. The method can therefore determine assignments of assemblies to component fitting lines that allow an improved utilization level for the overall component fitting system.

While the claimed method defines a first target function of the optimization method that is supposed to converge toward the best possible result for the differences from the respective expected value, the claimed method can additionally be augmented with a second target function. This second target function can take the assignment explained above as a basis for determining the number of equipment families for each component fitting line, wherein this number is supposed to be as low as possible on the component fitting lines in order to reduce the conversion time involvement. To limit and/or minimize the number of equipment families for each component fitting line, different threshold values per component fitting line may possibly be prescribed or predeterminable.

With further restrictions such as component variance and/or the number of equipment families in the second target function, it is possible to attain ever more accurate results that contribute to the maximum utilization level of the component fitting lines not being exceeded.

The user can manually prescribe whether the overall optimization with the two target functions is supposed to result in more weight being placed on the first target function or more weight being placed on the second target function.

A further aspect of embodiments of the invention provides an apparatus for assigning assemblies to component fitting lines for fitting the assemblies with components, having:
  a unit for ascertaining an expected production time for each assembly type of the assemblies to be fitted with components and for each component fitting line taking into consideration the respective cycle time for the assembly type on the component fitting line and the expected number of items to be produced per assembly type, wherein the actual number of items to be produced can arise according to a previously determinable probability distribution, wherein the possible assignments of assemblies to component fitting lines can be limited by the existing infrastructure and/or by user-defined presets, and
  a unit for computing the assignment of the assemblies to the component fitting lines by means of an optimization method, wherein the computation of the assignment is effected such that for the probability distributions with respect to the sum of the expected production times per component fitting line that result from the cited probability distributions for the numbers of items, the differences from the respective expected value of these resultant probability distributions are minimizable.

The apparatus can provide means and/or units or devices and/or modules for performing the method cited above that may each be fashioned in hardware and/or in firmware and/or in software or as a computer program or computer program product.

The apparatus can be developed as appropriate like the method described above.

A further aspect of embodiments of the invention provides a production or assembly line arrangement for fitting assemblies with components, wherein the assignment of the assemblies to the production or assembly line is determinable according to the method explained above.

This production or assembly line arrangement may be part of an installation.

The installation may be characterized by one of the following installation types, inter alia. Examples of these are:
  an automation installation,
  a production installation,
  a cleaning installation,
  a water conditioning installation,
  an appliance or a machine,
  a turbomachine,
  a power generation installation,
  a power grid,
  a communication network,
  a medico-technical device or appliance,
  a hospital information system.

A further aspect of embodiments of the invention is a computer program product or a computer program having means for performing the aforementioned method when the computer program (product) is executed in an aforementioned apparatus or in means of the apparatus. The computer program or computer program product may be stored on a computer-readable medium. The computer program or computer program product may be written in a standard programming language (e.g. C++, Java). The processing device can comprise a commercially available computer or server having appropriate input, output and storage means. This processing device may be integrated in the apparatus or in the means thereof.

BRIEF DESCRIPTION

Some of the embodiments will be described in detail, with references to the following Figures, wherein like designations denote like members, wherein.

DETAILED DESCRIPTION

Figure 1:
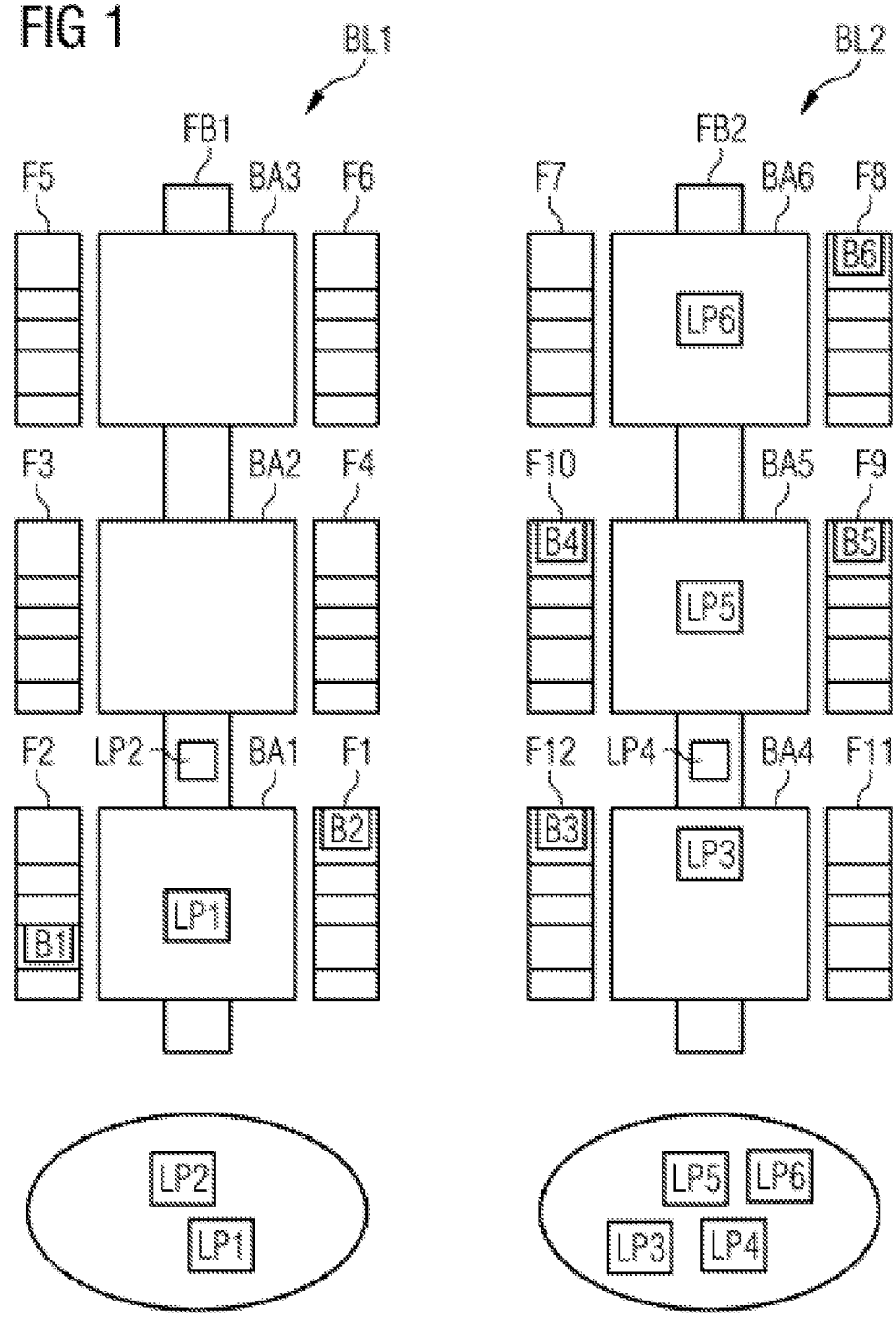
FIG. 1 shows a first exemplary assembly factory with component fitting lines for producing assemblies.

FIG. 1 shows a first exemplary assembly factory or an assembly installation with component fitting lines BL1-BL2 for producing assemblies. A component fitting line BL1-BL2 usually consists of component fitting machines BA1-BA6 that are each connected to one another by a transport system FB1-FB2 (e.g. conveyor belts) for transporting the assemblies LP1-LP6 to be fitted with components. The components or subassemblies B1-B6 to be fitted to the assemblies LP1-LP6 are usually provided on the component fitting machines BA1-BA6 by means of conveyors F1-F11. In this case, a component fitting line BL1, BL2 can be assigned multiple assemblies LP1-LP6 of a particular assembly type r from a set of assembly types R ($r \in R$).

Component fitting machines BA1-BA6 e.g. for fitting substrates with components B1-B6 have supply apparatuses F1-F11 for components B1-B6 arranged at the side on a transport path for the substrates. A component fitting head of the component fitting machine BA1-BA6, which component fitting head is movable by a positioning system, collects the components B1-B6 from the supply apparatuses F1-F11, moves them to a component fitting area of the component fitting machine in which the substrate to be fitted with components is provided, and drops the components B1-B6 on the substrate. For providing the components B1-B6, e.g. what are known as belt feeders are used, which are suitable for transporting and supplying subassemblies stored in belts. These transport the subassemblies stored in pocket-like depressions to a collection position at which the subassemblies are collected from the belt pockets by the component fitting head. The empty belt leaves the supply apparatus F1-F11 at a suitable position.

The text below describes, as the mathematical optimization method, IP (IP stands for integer programming or for integer program or integer optimization model) models for this problem. The use of exact mathematical methods allows much better solutions to be obtained than with heuristics and optimization methods used to date. IP approaches to a solution have the following advantages:

Global optimization approach.
Easily extendable.
Very good commercial standard solvers (e.g. Ilog, Xpress) that are widely used and proven in practice.
The standard solvers are continually being improved, which means that it can be expected that the instances will be solvable even more quickly in future.

These methods can be used to achieve good production times.

In the planning period, a set of assemblies is supposed to be fitted with components of different component types on multiple SMT lines. For each assembly r, it is estimated how many jobs there will be therefor and how often in total they have to be produced in the planning period. Using the cycle times on the various (component fitting) lines, the estimated conversion times and the levels of line use, it is possible to ascertain estimated total production times per assembly and line, which can serve as an input. A maximum production time is also prescribed per line in the planning period. The expected production time per assembly type can be ascertained using a unit that is not depicted in the figures. Such a unit may be integrated in a component fitting machine e.g. BA1 of the component fitting line BL1. A unit, not depicted, for computing the assignment of the assemblies to component fitting lines may also be integrated in such a component fitting machine.

These units may also be implemented or integrated in a computer controlling the component fitting machines that is separate from the component fitting machines.

The IP model depicted is intended to be regarded only as one possible exemplary formulation and is not a limitation for the method.

The aim is to restrict production time fluctuations for the individual lines or to minimize them as far as possible.

In the exemplary embodiment, the following parameters are used in the IP model:

Let L be the set of all (component fitting) lines and R be the set of all assembly types and $R_l$ be the set of assembly types to which components can be fitted on line l.

Further parameters are:

$n_r$ independent random variable for the number of items n to be produced for the assembly type r within a particular period $c_r$ fixed production time during the production of an arbitrary number of items at the assembly type r $t_{r,l}$ cycle time for the production of an assembly of the assembly type r on line l $VarMax_l$ maximum production time variance on the component fitting line l $TimeLimit_l$ production time limit on component fitting line l $Assign_{r,l}$ assignment of assembly type r to component fitting line l It is assumed that the production time for an assembly on a line is $t_{r,l} n_r + c_r$. In this case, $c_r$ is a constant component that includes the conversion times, for example. The production times for the assembly on a line are also independent random variables.

For a set $R_l' \subseteq R_l$ of assembly types assigned to a line l, the production time is therefore also a random variable, for whose variance the following holds:

$$\text{Var}(\text{line } l \text{ production time}) = \text{Var}\left(\sum_{r \in R_l'} t_{r,l} n_r + c_r\right)$$

$$= \sum_{r \in R_l'} t_{r,l}^2 \text{Var}(n_r)$$

In an IP model, restrictions are normally used. The following restrictions of the IP model restrict the expected production time on the lines and ensure the permissibility of the solution:

$$\sum_{r \in R} EW(t_{r,l}n_r + c_r) \text{Assign}_{r,l} \leq \text{TimeLimit}_l \; l \in L$$

The restrictions $$\text{Assign}_{r,l} = 0, l \in L, r \in R \setminus R_l$$

guarantee that assemblies can be assigned only to component fitting lines on which they can also have components fitted.

The restrictions $$\sum_{l \in L} \text{Assign}_{r,l} = 1 \; r \in R$$

assign each assembly type to precisely one component fitting line.

In the IP model, it is also possible for the production time variance of a component fitting line to be expressed as follows:

$$\text{Var(line } l \text{ production time)} = \sum_{r \in R_l} t_{r,l}^2 \text{Var}(n_r) \text{Assign}_{r,l} \; l \in L$$

The following variants for limiting the maximum production time variance on the lines are possible:
(1) Firmly prescribed parameters $\text{VarMax}_l$ allow the production time variances for all lines l to be limited by the additional restrictions $$\sum_{r \in R_l} t_{r,l}^2 \text{Var}(n_r) \text{Assign}_{r,l} \leq \text{VarMax}_l \; l \in L$$

(2) if $\text{VarMax}_l$ is selected as a variable, then using an auxiliary variable $V_{max}$ and additional restrictions $$\text{VarMax}_l \leq V_{max}, l \in L$$

it is possible to minimize $V_{max}$ to achieve the effect that the maximum production time variance of the lines is minimized as far as possible. $V_{max}$ can be included in the target function of the IP model in this case with a weight factor w.
(3) A further option is for the difference in the maximum and minimum variances of the lines to be restricted for a prescribed percentage p.

In this regard, let $V_{min}$ be a further auxiliary variable. Additional restrictions are $$V_{min} \leq \text{VarMax}_l \; l \in L$$

and $$V_{max} - V_{min} \leq \frac{p}{100} V_{max}$$

The restrictions depicted above for the variants (1) and (3) can also each be used to extend the IP model from DE 10 2011 076 565 B4, WO2014/005741 A1, WO2014/005743 A1, WO2014/005744 A1. The methods known from the cited documents are examples of optimization methods by means of MIP for assignments of assemblies to component fitting lines.

The patent application "Method and Apparatus for assigning assemblies to component fitting lines" with the same priority as the present patent application discloses the extension cited above.

Accordingly, production time fluctuations can be limited in these IP models too. Variant (2) can likewise be used to extend these IP models by virtue of $V_{max}$, in addition to the new restrictions, also being included in the target function with a chosen weighting.

The integer linear programming can be solved by the following steps:
a) ascertaining a starting solution or first current solution,
b) assigning a selected set of assemblies LP1-L6 to the component fitting lines BL1-BL2, based on a current solution,
c) computing the new assignments by means of an optimization program or a standard solver based on integer linear programming.

The steps can be performed iteratively and a program termination takes place if a previously stipulated time limit or result quality is reached.

The text below explains a simplified example intended to explain the optimization process, depicted in complex fashion above, in a simplified manner for comprehension, without being restricted to this simplified example. If the simple example with few instances described below is transferred to larger instances or more complex problems, a good or precise selection of parameters in the IP model with the restrictions to be applied or the user-defined presets is fundamental in order to be able to attain a solution to the complex problem with the aforementioned standard solvers in the first place.

In the example below, it is assumed that, for an assembly type given a forecast number of items of n, the number of items actually to be produced or have components fitted fluctuates according to the following probability distribution:
  the forecast value n is assumed with a probability of 0.8.
  a 10% difference in the value n at the top or bottom is assumed with a probability of 0.1 in each case.

Six different assembly types are supposed to be assigned to two lines BL1 and BL2. The forecast numbers of items n are:

| r1 | r2 | r3 | r4 | r5 | r6 |
|---|---|---|---|---|---|
| 2000 | 2000 | 1000 | 1000 | 1000 | 1000 |

The assignment is supposed to be made such that the two lines have the same utilization level, i.e. the same expected production times. The cycle times are 1 min for all assembly types, and therefore e.g. the production time is 1000 min when the number of items is 1000.

Figure 2:
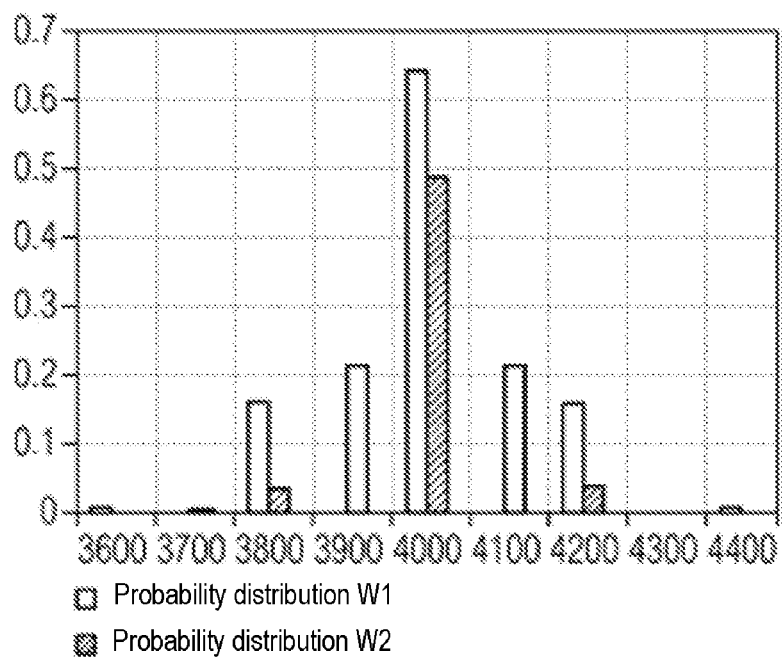
FIG. 2 shows a graph of the probability distributions for the numbers of items/production times of the component fitting lines 1 and 2 of FIG. 2 for an assembly line assignment.

As a possible starting solution, r1 and r2 may be assigned to the line BL1 and the assemblies r3 to r6 may be assigned to the line BL2. The following probability distributions W1 and W2 for the numbers of items/production times on the two lines BL1 and BL2 are thus obtained, as depicted in the table below and in FIG. 2.

|  | Probability distribution of BL1 | Probability distribution of BL2 |
|---|---|---|
| 3600 | 0.01 | 0.0001 |
| 3700 |  | 0.0032 |

-continued

| | Probability distribution of BL1 | Probability distribution of BL2 |
|---|---|---|
| 3800 | 0.16 | 0.0388 |
| 3900 | | 0.2144 |
| 4000 | 0.64 | 0.487 |
| 4100 | | 0.2144 |
| 4200 | 0.16 | 0.0388 |
| 4300 | | 0.0032 |
| 4400 | 0.01 | 0.0001 |

On line BL1, the two assembly types with large numbers of items mean that a large range of fluctuation is obtained for the numbers of items/production times.

Figure 3:
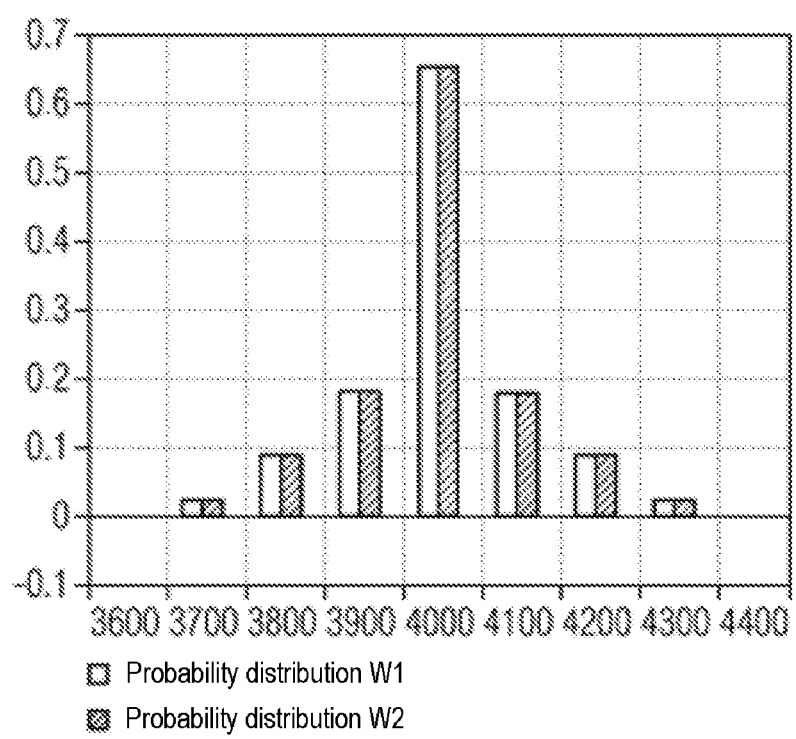
FIG. 3 shows a graph of said probability distributions based on the optimization approach according to embodiments of the invention for an assembly line assignment.

If, on the other hand, the two assembly types r1 and r2 are split over the lines BL1 and BL2, then, the following probability distributions W1 and W2 for the numbers of items/production times on the two lines BL1 and BL2 are obtained, as depicted in the table below and in FIG. 3.

| | Probability distribution of BL1 | Probability distribution of BL2 |
|---|---|---|
| 3600 | 0.001 | 0.001 |
| 3700 | 0.016 | 0.016 |
| 3800 | 0.074 | 0.074 |
| 3900 | 0.144 | 0.144 |
| 4000 | 0.53 | 0.53 |
| 4100 | 0.144 | 0.144 |
| 4200 | 0.074 | 0.074 |
| 4300 | 0.016 | 0.016 |
| 4400 | 0.001 | 0.001 |

The maximum variance in the case of the first assignment is $$2*(400^2*0.01+200^2*0.16)=16000$$

and decreases by 25% in the case of the second assignment to $$2*(400^2*0.001+300^2*0.016+200^2*0.074+100^2*0.144)=12000$$

In the middle and at the edge, the values of the distributions for line BL1 and line BL2 in the case of the second assignment of lines for assemblies are much lower than the values of the distribution for line BL1 in the case of the first assignment of lines for assemblies. At the edge, the probability is even now only a tenth.

Given a suitable choice of parameters, it is specifically possible for the second assignment of lines for assemblies explained above to be ascertained. The steps of the optimization can be performed iteratively and a program termination can take place effected if a previously stipulated time limit or a prescribable result quality is reached.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for producing assemblies using a plurality of component fitting lines, the method comprising:
ascertaining an expected production time for each assembly type of the assemblies to be fitted with components and each component fitting line taking into consideration a respective cycle time for the assembly type on the component fitting line, and an expected number of items to be produced per assembly type, wherein an actual number of items to be produced arises according to a previously determinable probability distribution, wherein possible assignments of assemblies to component fitting lines are limited by at least one of the existing infrastructure and user-defined presets;
computing the assignment of the assemblies to the component fitting lines by means of an optimization method, wherein the computing of the assignment is effected such that for probability distributions with respect to the expected production times per component fitting line that result from the probability distributions for the numbers of items, a sum of differences from the respective expected value of these resultant probability distributions is minimized, wherein the sum of differences of the respective expected values is expressed as a variance within a time period based on a product of a square of the differences from the respective expected values, and wherein the computed assignment balances expected utilization levels of each of the plurality of component fitting lines; and
producing the assemblies using the computed assignment of the assemblies to the component fitting lines.

2. The method as claimed in claim 1, wherein the differences from the expected values of the resultant probability distributions assume at least one of substantially identical values and values having a difference within a maximum difference.

3. The method as claimed in claim 1, wherein the sum of the expected production times for the set of assemblies that is assigned to a component fitting line does not exceed a maximum utilization level of the respective component fitting line over time.

4. The method as claimed in claim 1, wherein the optimization method is integer linear programming.

5. The method as claimed in claim 1, wherein the difference from the sum of the expected production times of a component fitting line is limited to a prescribable maximum threshold value.

6. The method as claimed in claim 5, wherein the prescribable maximum threshold value is minimized.

7. The method as claimed in the preceding claim 5, wherein the prescribable maximum threshold value is prescribed in the form of an interval limited at at least one of the top and the bottom.

8. The method as claimed in claim 7, wherein a width of the interval is stipulated as a percentage on a basis of one of the values limiting the interval.

9. The method as claimed in claim 1, wherein each assembly type is assigned to precisely one component fitting line.

10. A production or assembly line arrangement for fitting assemblies with components, wherein the assignment of the assemblies is determinable according to a method as claimed in claim 1, and wherein the production or assembly line arrangement fits the assemblies with the components using the computed assignment of the assemblies to the component fitting lines.

11. An apparatus for controlling production of assemblies using a plurality of component fitting lines, the apparatus comprising:
  a unit for ascertaining an expected production time for each assembly type of the assemblies to be fitted with components and for each component fitting line taking into consideration a respective cycle time for the assembly type on the component fitting line and an expected number of items to be produced per assembly type, wherein an actual number of items to be produced arises according to a previously determinable probability distribution, wherein possible assignments of assemblies to component fitting lines are limited by at least one of the existing infrastructure and by user-defined presets; and
  a unit for computing the assignment of the assemblies to the component fitting lines by means of an optimization method, wherein the computing of the assignment is effected such that for probability distributions with respect to the expected production times per component fitting line that result from the probability distributions for the numbers of items, a sum of differences from the respective expected value of these resultant probability distributions is minimizable, wherein the sum of differences of the respective expected values is expressed as a variance within a time period based on a product of a square of the differences from the respective expected values, and wherein the computed assignment balances expected utilization levels of each of the plurality of component fitting lines;
  wherein the apparatus controls production of the assemblies using the computed assignment of the assemblies to the component fitting lines.

12. The apparatus as claimed in claim 11, wherein the differences from the expected values of the resultant probability distributions assume at least one of substantially identical values and values having a difference within a maximum difference.

13. The apparatus as claimed in claim 11, wherein the sum of the expected production times for the set of assemblies that is assigned to a component fitting line does not exceed a maximum utilization level of the respective component fitting line over time.

14. The apparatus as claimed in claim 11, wherein the optimization method is integer linear programming.

15. The apparatus as claimed in claim 11, wherein the difference from the sum of the expected production times of a component fitting line is limitable to a prescribable maximum threshold value.

16. The apparatus as claimed in claim 15, wherein the prescribable maximum threshold value is minimizable.

17. The apparatus as claimed in the preceding claim 15 wherein the prescribable maximum threshold value is prescribed in the form of an interval limited at at least one of the top and the bottom.

18. The apparatus as claimed in claim 17, wherein a width of the interval is stipulated as a percentage on a basis of one of the values limiting the interval.

19. The apparatus as claimed in claim 11, wherein each assembly type is assigned to precisely one component fitting line.

20. A computer program product comprising a non-transitory computer readable hardware storage device storing a computer readable program code, the computer readable program code comprising an algorithm that when executed by a computer processor of a computing system implements the method as claimed in claim 11.

21. A non-transitory computer-readable medium, comprising instructions that, when executed on the apparatus as claimed in claim 11, prompts the apparatus to perform a method for assigning assemblies to component fitting lines for fitting the assemblies with components.

\* \* \* \* \*